(12) United States Patent
Kido et al.

(10) Patent No.: US 11,241,745 B2
(45) Date of Patent: *Feb. 8, 2022

(54) CUTTING TOOL INCLUDING SUBSTRATE AND COATING LAYER

(71) Applicant: SUMITOMO ELECTRIC HARDMETAL CORP., Itami (JP)

(72) Inventors: Yasuki Kido, Itami (JP); Anongsack Paseuth, Itami (JP); Susumu Okuno, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/254,521

(22) PCT Filed: Jun. 22, 2020

(86) PCT No.: PCT/JP2020/024323
§ 371 (c)(1),
(2) Date: Dec. 21, 2020

(87) PCT Pub. No.: WO2021/070419
PCT Pub. Date: Apr. 15, 2021

(65) Prior Publication Data
US 2021/0237169 A1    Aug. 5, 2021

(30) Foreign Application Priority Data
Oct. 10, 2019   (JP) .............................. JP2019-186818

(51) Int. Cl.
*B23B 27/14*    (2006.01)
*C23C 14/06*    (2006.01)
*C23C 16/30*    (2006.01)

(52) U.S. Cl.
CPC ........ *B23B 27/148* (2013.01); *C23C 14/0617* (2013.01); *C23C 16/301* (2013.01);
(Continued)

(58) Field of Classification Search
CPC ......... C30B 25/00; C30B 25/02; C30B 25/22; C30B 29/00; C30B 29/10; C30B 29/38;
(Continued)

(56) References Cited

U.S. PATENT DOCUMENTS 6,250,855 B1    6/2001  Persson et al.
2005/0129986 A1  6/2005  Sata et al.
(Continued)

FOREIGN PATENT DOCUMENTS

JP    2000-308916 A    11/2000
JP    2003-211304 A    7/2003
(Continued)

OTHER PUBLICATIONS

U.S. Appl. No. 17/254,427, filed Dec. 2020, Kido, et al.*
(Continued)

*Primary Examiner* — Kenneth A Bratland, Jr.
(74) *Attorney, Agent, or Firm* — Faegre Drinker Biddle & Reath LLP

(57) ABSTRACT

A cutting tool comprises a substrate and a coating layer provided on the substrate, the coating layer including a multilayer structure layer composed of a first unit layer and a second unit layer, and a lone layer, the lone layer including cubic $Ti_zAl_{1-z}N$ crystal grains, an atomic ratio z of Ti in the $Ti_zAl_{1-z}N$ being 0.4 or more and less than 0.55, the lone layer having a thickness with an average value of 2.5 nm or more and 10 nm or less, the multilayer structure layer having a thickness with an average value of 40 nm or more and 95 nm or less, one multilayer structure layer and one lone layer forming a repetitive unit having a thickness with an average
(Continued)

value of 50 nm to 100 nm, a maximum value of 90 nm to 110 nm, and a minimum value of 40 nm to 60 nm.

6 Claims, 4 Drawing Sheets

(52) U.S. Cl.
CPC ....... *B23B 2222/04* (2013.01); *B23B 2222/88* (2013.01); *B23B 2228/105* (2013.01)

(58) Field of Classification Search
CPC ............ C23C 14/0617; C23C 14/0641; C23C 16/301; C23C 16/34; B23B 27/148; B23B 2222/04; B23B 2222/88; B23B 2222/105
USPC ............. 428/411.1, 457, 688–689, 697–699; 117/84, 88–89, 105, 937, 952
See application file for complete search history.

(56) References Cited

U.S. PATENT DOCUMENTS

| | | | |
|---|---|---|---|
| 2011/0293384 A1 | 12/2011 | Johansson et al. | |
| 2014/0272391 A1 | 9/2014 | Kumar et al. | |
| 2017/0021429 A1* | 1/2017 | Paseuth | C23C 16/52 |
| 2018/0071829 A1 | 3/2018 | Hirano | |
| 2018/0133805 A1 | 5/2018 | Paseuth et al. | |
| 2018/0135168 A1 | 5/2018 | Paseuth et al. | |
| 2018/0223415 A1 | 8/2018 | Albers et al. | |

FOREIGN PATENT DOCUMENTS

| | | |
|---|---|---|
| JP | 2003-326403 A | 11/2003 |
| JP | 2012-35379 A | 2/2012 |
| JP | 2013-518734 A | 5/2013 |
| JP | 2016-26893 A | 2/2016 |
| JP | 2016-137549 A | 8/2016 |
| JP | 2017-185609 A | 10/2017 |
| JP | 2017-189848 A | 10/2017 |
| JP | 2019-063982 A | 4/2019 |
| WO | WO-2011/099683 A1 | 8/2011 |

OTHER PUBLICATIONS

U.S. Appl. No. 17/254,396, filed Dec. 2020, Kido, et al.*
U.S. Appl. No. 17/254,444, filed Dec. 2020, Kido, et al.*
U.S. Appl. No. 17/254,411, filed Dec. 2020, Kido, et al.*
Kido, Yasuki, et al., "Cutting Tool," U.S. Appl. No. 17/254,396, filed Dec. 21, 2020, including as-filed specification, claims, abstract and drawings, 45 pages.
Kido, Yasuki, et al., "Cutting Tool," U.S. Appl. No. 17/254,411, filed Dec. 21, 2020, including as-filed specification, claims, abstract and drawings, 45 pages.
Kido, Yasuki, et al., "Cutting Tool," U.S. Appl. No. 17/254,427, filed Dec. 21, 2020, including as-filed specification, claims, abstract and drawings, 47 pages.
Kido, Yasuki, et al., "Cutting Tool," U.S. Appl. No. 17/254,444, filed Dec. 21, 2020, including as-filed specification, claims, abstract and drawings, 45 pages.
Office Action dated Jun. 22, 2021 that issued in U.S. Appl. No. 17/254,444.
Office Action dated Jun. 25, 2021 that issued in U.S. Appl. No. 17/254,427.
Office Action dated Jul. 9, 2021 that issued in U.S. Appl. No. 17/254,411.
Office Action dated Sep. 28, 2021 that issued in U.S. Appl. No. 17/254,396.
Notice of Allowance dated Sep. 13, 2021 that issued in U.S. Appl. No. 17/254,444.
Notice of Allowance dated Sep. 21, 2021 that issued in U.S. Appl. No. 17/254,411.
Notice of Allowance dated Sep. 1, 2021 that issued in U.S. Appl. No. 17/254,427.
Notice of Allowance dated Dec. 22, 2021 that issued in U.S. Appl. No. 17/254,396.

* cited by examiner

CUTTING TOOL INCLUDING SUBSTRATE AND COATING LAYER

TECHNICAL FIELD

The present disclosure relates to a cutting tool. The present application claims priority based on Japanese Patent Application No. 2019-186818 filed on Oct. 10, 2019. The disclosure in the Japanese patent application is entirely incorporated herein by reference.

BACKGROUND ART

Conventionally, cutting tools made of cemented carbide or cubic boron nitride (cBN) sintered material have been used to cut steel, castings, and the like. When such a cutting tool is used to cut a workpiece the cutting tool has its cutting edge exposed to a severe environment such as high temperature and high stress, which invites wearing and chipping of the cutting edge.

Accordingly, suppression of wearing and chipping of the cutting edge is important in improving the cutting performance of the cutting tool and hence extending the life of the cutting tool.

For the purpose of improving a cutting tool's cutting performance (e.g., breaking resistance, wear resistance, impact resistance, and oxidation resistance), development of a coating for coating a surface of a substrate of cemented carbide, cBN sintered material and the like is underway. Inter alia, a coating including a layer composed of a compound of aluminum (Al), titanium (Ti), and nitrogen (N) (hereinafter also referred to as "AlTiN") can have high hardness and also enhance oxidation resistance (for example, see Japanese Patent Laid-Open No. 2016-137549 (PTL 1), Japanese Patent Laid-Open No. 2017-185609 (PTL 2), Japanese Patent Laid-Open No. 2017-189848 (PTL 3), and Japanese Patent Laid-Open No. 2019-063982 (PTL 4)).

CITATION LIST

Patent Literature

PTL 1: Japanese Patent Laid-open No. 2016-137549
PTL 2: Japanese Patent Laid-Open No. 2017-185609
PTL 3: Japanese Patent Laid-Open No. 2017-189848
PTL 4: Japanese Patent Laid-open No. 2019-063982

SUMMARY OF INVENTION

The presently disclosed cutting tool is
a cutting tool comprising a substrate and a coating layer provided on the substrate,
the coating layer including a multilayer structure layer composed of a first unit layer and a second unit layer, and a lone layer,
the first unit layer and the second unit layer being alternately stacked,
the multilayer structure layer and the lone layer being stacked such that more than one multilayer structure layer and more than one lone layer are alternately stacked,
the first unit layer including cubic $Al_xTi_{1-x}N$ crystal grains,
the second unit layer including cubic $Al_yTi_{1-y}N$ crystal grains,
the lone layer including cubic $Ti_zAl_{1-z}N$ crystal grains,
an atomic ratio x of Al in the being 0.8 or more and 0.95 or less,
an atomic ratio y of Al in the $Al_yTi_{1-y}N$ being 0.7 or more and less than 0.8,
an atomic ratio z of Ti in the $Ti_zAl_{1-z}N$ being 0.4 or more and less than 0.55,
the first unit layer having a thickness with an average value of 2.5 nm or more and 5 nm or less,
the second unit layer having a thickness with an average value of 2.5 nm or more and 5 nm or less,
the multilayer structure layer having a thickness with an average value of 40 nm or more and 95 nm or less,
the lone layer having a thickness with an average value of 2.5 nm or more and 10 nm or less,
one multilayer structure layer and one lone layer forming a repetitive unit having a thickness with an average value of 50 nm or more and 100 nm or less, a maximum value of 90 nm or more and 110 nm or less, and a minimum value of 40 nm or more and 60 nm or less.

DETAILED DESCRIPTION

Figure 1:
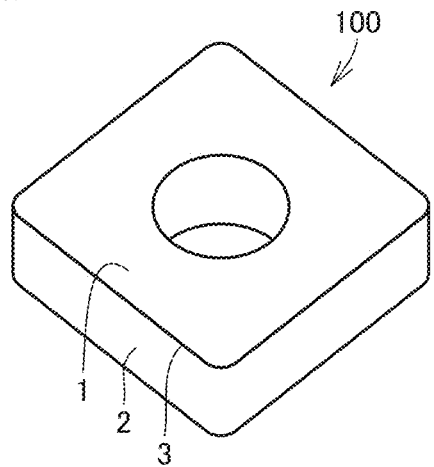
FIG. 1 is a perspective view of one embodiment of a cutting tool by way of example.

Problem to be Solved by the Present Disclosure

PTL 1 to PTL 4 describe that the layer of AlTiN configuring the coating forms an ultra-multilayer structure to improve the cutting performance of the cutting tool provided with the coating. In recent years, however, more efficient (or higher feed rate) cutting has been demanded, and further improvement is expected in impact resistance and oxidation resistance of a cutting tool used for high speed processing of stainless steel (e.g., SUS304), in particular.

The present disclosure has been made in view of the above circumstances, and an object thereof is to provide a cutting tool having excellent impact resistance and excellent oxidation resistance.

Advantageous Effect of the Present Disclosure

According to the present disclosure, a cutting tool having excellent impact resistance and excellent oxidation resistance can be provided.

DESCRIPTION OF EMBODIMENTS OF THE PRESENT DISCLOSURE

Initially, embodiments of the present disclosure will be listed and described.

[1] A surface-coated cutting tool according to the present disclosure is a cutting tool comprising a substrate and a coating layer provided on the substrate, the coating layer including a multilayer structure layer composed of a first unit layer and a second unit layer, and a lone layer, the first unit layer and the second unit layer being alternately stacked, the multilayer structure layer and the lone layer being stacked such that more than one multilayer structure layer and more than one lone layer are alternately stacked, the first unit layer including cubic $Al_xTi_{1-x}N$ crystal grains, the second unit layer including cubic $Al_yTi_{1-y}N$ crystal grains, the lone layer including cubic $Ti_zAl_{1-z}N$ crystal grains, an atomic ratio x of Al in the being 0.8 or more and 0.95 or less, an atomic ratio y of Al in the $Al_yTi_{1-y}N$ being 0.7 or more and less than 0.8, an atomic ratio z of Ti in the $Ti_zAl_{1-z}N$ being 0.4 or more and less than 0.55, the first unit layer having a thickness with an average value of 2.5 nm or more and 5 nm or less, the second unit layer having a thickness with an average value of 2.5 nm or more and 5 nm or less, the multilayer structure layer having a thickness with an average value of 40 nm or more and 95 nm or less, the lone layer having a thickness with an average value of 2.5 nm or more and 10 nm or less, one multilayer structure layer and one lone layer forming a repetitive unit having a thickness with an average value of 50 nm or more and 100 nm or less, a maximum value of 90 nm or more and 110 nm or less, and a minimum value of 40 nm or more and 60 nm or less.

The above cutting tool thus configured has excellent impact resistance and excellent oxidation resistance. As used herein, "impact resistance" means resistance to breakage of a cutting edge portion in a cutting process in which the cutting edge portion receives a large impact. As used herein, "oxidation resistance" means resistance to breakage attributed to oxidation of a cutting edge portion in a cutting process in which the cutting edge portion attains high temperature.

[2] The lone layer preferably has a thickness with an average value of 2.5 nm or more and 5 nm or less. By defining in this way, the cutting tool can be further excellent in impact resistance.

[3] Preferably, the repetitive unit has a thickness with an average value of 55 nm or more and 95 nm or less, a maximum value of 90 nm or more and 100 nm or less, and a minimum value of 50 nm or more and 60 nm or less. By defining in this way, the cutting tool can be further excellent in impact resistance.

[4] Preferably, the coating layer has a thickness with an average value of 0.1 nm or more and 10 μm or less. By defining in this way, the cutting tool can be excellent in wear resistance in addition to impact resistance and oxidation resistance.

[5] Preferably, the cutting tool further comprises an underlying layer provided between the substrate and the coating layer, wherein the underlying layer is composed of a compound consisting of: at least one element selected from the group consisting of a group 4 element, a group 5 element and a group 6 element of the periodic table and aluminum; and at least one element selected from the group consisting of carbon, nitrogen, oxygen and boron, and the underlying layer is different in composition from the first unit layer, the second unit layer, and the lone layer. By defining in this way, the cutting tool can have excellent impact resistance and excellent oxidation resistance and, in addition thereto, the coating layer with excellent peeling resistance.

[6] Preferably, the cutting tool further comprises a surface layer provided on the coating layer, wherein the surface layer is composed of a compound consisting of: at least one element selected from the group consisting of a group 4 element, a group 5 element and a group 6 element of the periodic table and aluminum; and at least one element selected from the group consisting of carbon, nitrogen, oxygen and boron, and the surface layer is different in composition from the first unit layer, the second unit layer, and the lone layer. By defining in this way, the cutting tool can be further excellent in wear resistance in addition to impact resistance and oxidation resistance.

Detailed Description of Embodiments of the Present Disclosure

Hereinafter, an embodiment of the present disclosure (hereinafter also referred to as "the present embodiment") will be described. It should be noted, however, that the present embodiment is not exclusive. In the present specification, an expression in the form of "A to Z" means a range's upper and lower limits (that is, A or more and Z or less), and when A is not accompanied by any unit and Z is alone accompanied by a unit, A has the same unit as Z. Further, in the present specification, when a compound is represented by a chemical formula with its constituent elements' compositional ratio unspecified, such as "TiN," the chemical formula shall encompass any conventionally known compositional ratio (or elemental ratio). The chemical formula shall include not only a stoichiometric composition but also a nonstoichiometric composition. For example, the chemical formula of "TiN" includes not only a stoichiometric composition of "$Ti_1N_1$" but also a nonstoichiometric composition for example of "$Ti_1N_{0.8}$." This also applies to descriptions for compounds other than "TiN."

<<Cutting Tool>>

The presently disclosed cutting tool is a cutting tool comprising a substrate and a coating layer provided on the substrate, the coating layer including a multilayer structure layer composed of a first unit layer and a second unit layer, and a lone layer, the first unit layer and the second unit layer being alternately stacked, the multilayer structure layer and the lone layer being stacked such that more than one multilayer structure layer and more than one lone layer are alternately stacked, the first unit layer including cubic $Al_xTi_{1-x}N$ crystal grains, the second unit layer including cubic $Al_yTi_{1-y}N$ crystal grains, the lone layer including cubic $Ti_zAl_{1-z}N$ crystal grains, an atomic ratio x of Al in the being 0.8 or more and 0.95 or less, an atomic ratio y of Al in the $Al_yTi_{1-y}N$ being 0.7 or more and less than 0.8, an atomic ratio z of Ti in the $Ti_zAl_{1-z}N$ being 0.4 or more and less than 0.55, the first unit layer having a thickness with an average value of 2.5 nm or more and 5 nm or less, the second unit layer having a thickness with an average value of 2.5 nm or more and 5 nm or less, the multilayer structure layer having a thickness with an average value of 40 nm or more and 95 nm or less, the lone layer having a thickness with an average value of 2.5 nm or more and 10 nm or less, one multilayer structure layer and one lone layer forming a repetitive unit having a thickness with an average value of 50 nm or more and 100 nm or less, a maximum value of 90 nm or more and 110 nm or less, and a minimum value of 40 nm or more and 60 nm or less.

Figure 2:
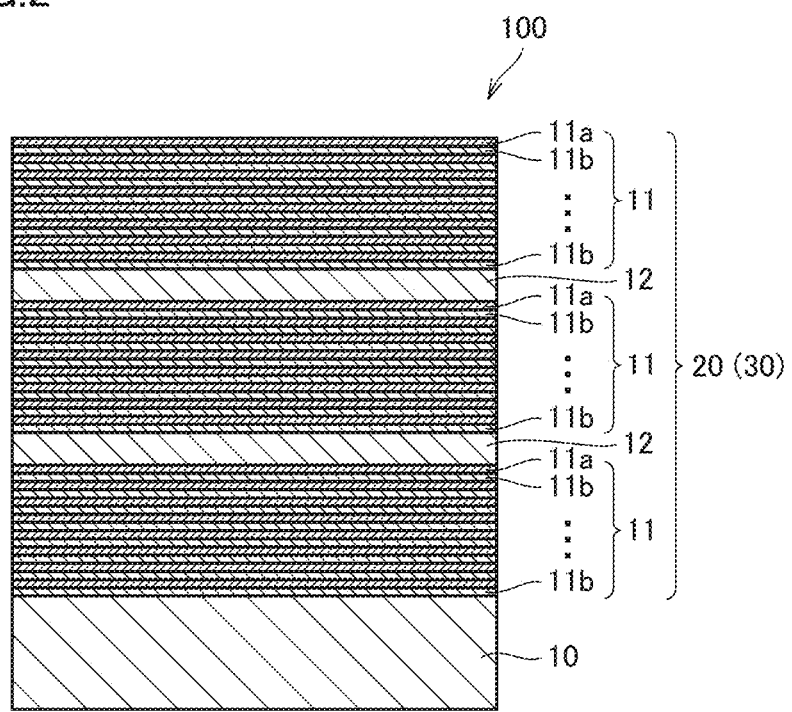
FIG. 2 is a schematic cross section of one embodiment of the cutting tool by way of example.
Figure 3:
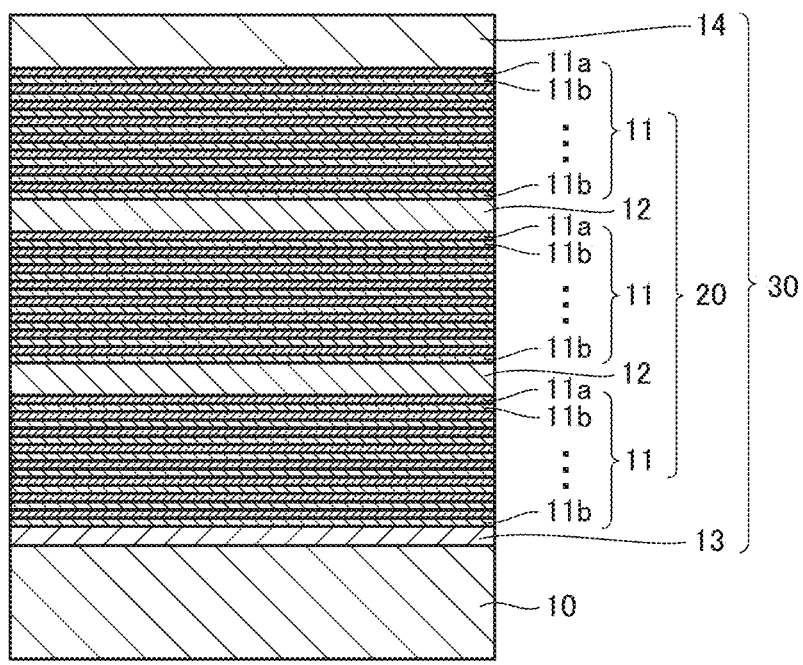
FIG. 3 is a schematic cross section of another embodiment of the cutting tool by way of example.

A cutting tool 100 of the present embodiment comprises a substrate 10, and a coating layer 20 provided on substrate 10 (hereinafter also simply referred to as a "cutting tool") (see FIG. 2). In addition to coating layer 20, cutting tool 100 may further comprise an underlying layer 13 provided between substrate 10 and coating layer 20 (see FIG. 3). Cutting tool 100 may further comprise a surface layer 14 provided on coating layer 20 (see FIG. 3). Other layers such as underlying layer 13 and surface layer 14 will be described hereinafter.

The above-described layers provided on substrate 10 may be collectively referred to as a "coating." That is, cutting tool 100 comprises a coating 30 provided on substrate 10, and the coating includes coating layer 20. Further, coating 30 may further include underlying layer 13 or surface layer 14.

The cutting tool can for example be a drill, an end mill (e.g., a ball end mill), an indexable cutting insert for a drill, an indexable cutting insert for an end mill, an indexable cutting insert for milling, an indexable cutting insert for turning, a metal saw, a gear cutting tool, a reamer, a tap, or the like.

FIG. 1 is a perspective view of one embodiment of the cutting tool by way of example. The cutting tool having such a shape is used as, for example, an indexable cutting insert. Cutting tool 100 has a rake face 1, a flank face 2, and a cutting edge ridge portion 3 where rake face 1 and flank face 2 meet each other. That is, rake face 1 and flank face 2 are faces that are connected with cutting edge ridge portion 3 interposed therebetween. Cutting edge ridge portion 3 constitutes a tip of the cutting edge of cutting tool 100. Such a shape of cutting tool 100 can also be understood as a shape of a substrate of the cutting tool. That is, the substrate has a rake face, a flank face, and a cutting edge ridge portion connecting the rake face and the flank face together.

<Substrate>

The substrate of the present embodiment can be any substrate conventionally known as a substrate of this type. For example, it preferably includes at least one selected from the group consisting of a cemented carbide (for example, a tungsten carbide (WC)-base cemented carbide, a cemented carbide containing WC and, in addition, Co, a cemented carbide containing WC with a carbonitride of Cr, Ti, Ta, Nb, or the like added, and the like), a cermet (mainly composed of TiC, TiN, TiCN, or the like), a high-speed steel, ceramics (titanium carbide, silicon carbide, silicon nitride, aluminum nitride, aluminum oxide, and the like), a cubic boron nitride sintered material (a cBN sintered material), and a diamond sintered material.

Of these various types of substrates, it is particularly preferable to select a cemented carbide (a WC-base cemented carbide, in particular) or a cermet (a TiCN-base cermet, in particular). This is because these substrates are particularly excellent in balance between hardness and strength at high temperature, in particular, and present excellent characteristics as a substrate for a cutting tool for the above-described applications.

When using a cemented carbide as a substrate, the effect of the present embodiment is exhibited even if the cemented carbide has a structure including free carbon or an extraordinary phase referred to as η phase. Note that the substrate used in the present embodiment may have its surface modified. For example, for the cemented carbide, the surface may be provided with a β-free layer, and for the cermet, the surface may be provided with a surface hardened layer, and even if the surface is modified in this way, the effect of the present embodiment is exhibited.

<Coating>

A coating according to the present embodiment includes a coating layer provided on the substrate. The "coating" coats at least a part of the substrate (for example, a rake face that comes into contact with chips during a cutting process, a flank face that comes into contact with a workpiece, and the like) to exhibit a function to improve the cutting tool's various characteristics such as breaking resistance, wear resistance, impact resistance, and oxidation resistance. The coating is preferably applied not only to a part of the substrate but also to the entire surface of the substrate. However, even if the substrate is partially uncoated with the coating or the coating is partially different in configuration, such does not depart from the scope of the present embodiment.

The coating preferably has a thickness of 0.1 µm or more and 30 µm or less, more preferably 2 µm or more and 20 µm or less. In one aspect of the present embodiment, the coating may have a thickness of 0.1 µm or more and 10 µm or less, and the coating may have a thickness of 2 µm or more and 10 µm or less. Note that the thickness of the coating means a total thickness of any layers constituting the coating. A "layer constituting the coating" for example includes a coating layer (a multilayer structure layer and a lone layer), an underlying layer, a surface layer, and the like, as will be described hereinafter. For example, the thickness of the coating can be measured by measuring 10 points selected, as desired, in a sample in a cross section parallel to the direction of a normal to a surface of the substrate with a scanning transmission electron microscope (STEM), and calculating an average value of the measured 10 points in thickness. In doing so, a numerical value which seems to be an apparently unexpected value is excluded. In one aspect of the present embodiment, the "thickness of the coating" can also be understood as an average value in thickness of the coating. The same applies when measuring in thickness the coating layer (multilayer structure layer and lone layer), underlying layer, surface layer and the like described hereinafter. The scanning transmission electron microscope is JEM-2100F (trade name) manufactured by JEOL Ltd., for example.

(Coating Layer)

The coating layer in the present embodiment is provided on the substrate. Note that being "provided on the substrate" is not limited to being provided directly on the substrate and also includes being provided on the substrate via another layer. That is, the coating layer may be provided directly on the substrate or may be provided on the substrate via another layer such as an underlying layer described hereinafter insofar as such does not impair an effect of the present disclosure. The coating layer may be provided thereon with another layer such as a surface layer. The coating layer may be an outermost surface layer of the coating.

The coating layer includes a multilayer structure layer composed of a first unit layer and a second unit layer, and a lone layer. The multilayer structure layer and the lone layer are stacked such that more than one multilayer structure layer and more than one lone layer are alternately stacked. In one aspect of the present embodiment, the coating layer may have a lowermost layer composed of the multilayer structure layer or the lone layer. In another aspect of the present embodiment, the coating layer may have an uppermost layer composed of the multilayer structure layer or the lone layer. As used herein, a "lowermost layer" means a layer of those configuring the coating layer that is closest to the substrate. As used herein, an "uppermost layer" means a layer of those configuring the coating layer that is farthest from the substrate.

The coating layer preferably has a thickness with an average value of 0.1 μm or more and 10 μm or less, more preferably 2 μm or more and 10 μm or less. The coating layer's average value in thickness can be confirmed by observing a vertical cross section of the substrate and the coating with a STEM in a method similar to that described above. Hereinafter, the multilayer structure layer and the lone layer that configure the coating layer will be described.

(Multilayer Structure Layer)

The multilayer structure layer is composed of a first unit layer and a second unit layer. The first unit layer and the second unit layer are alternately stacked. In one aspect of the present embodiment, the multilayer structure layer may have a lowermost layer composed of the first unit layer or the second unit layer. In another aspect of the present embodiment, the multilayer structure layer may have an uppermost layer composed of the first unit layer or the second unit layer. As used herein, a "lowermost layer" means a layer of those configuring the multilayer structure layer that is closest to the substrate. As used herein, an "uppermost layer" means a layer of those configuring the multilayer structure layer that is farthest from the substrate.

The multilayer structure layer has a thickness with an average value of 40 nm or more and 95 nm or less, preferably 45 nm or more and 80 nm or less. The multilayer structure layer's average value in thickness is determined as follows: Initially, a method similar to that described above is used to observe a vertical cross section of the substrate and the coating with a STEM to determine each multilayer structure layer's thickness. Subsequently, an average value in thickness of the multilayer structure layers (that is, an average value of a plurality of multilayer structure layers) is determined, and this average value is defined as an average value in thickness of the multilayer structure layer.

(First Unit Layer)

The first unit layer includes cubic $Al_xTi_{1-x}N$ crystal grains. That is, the first unit layer is a layer including a polycrystal having a composition of $Al_xTi_{1-x}N$. Herein, the chemical formula of "$Al_xTi_{1-x}N$" has a compositional ratio (or an elemental ratio) of "$Al_xTi_{1-x}$" and "N" including not only a stoichiometric composition (e.g., $(Al_xTi_{1-x})$) but also a non-stoichiometric composition (e.g., $(Al_xTi_{1-x})_1N_{0.8}$). "$Al_yTi_{1-y}N$" and "$Ti_zAl_{1-z}N$" described hereinafter are similarly discussed. An atomic ratio x of Al in the $Al_xTi_{1-x}N$ is 0.8 or more and 0.95 or less, preferably 0.8 or more and 0.9 or less. The atomic ratio x can be determined by analyzing crystal grains in the first unit layer appearing in a sample in the above-described cross section with an energy dispersive X-ray (EDX) spectrometer accompanying a transmission electron microscope (TEM). The atomic ratio x of Al thus determined is a value determined as an average of all of the crystal grains of the $Al_xTi_{1-x}N$. Specifically, 10 points selected, as desired, in the first unit layer in a sample in the above-described cross section is each measured to obtain a value of an atomic ratio of Al, and an average value of such values obtained at the 10 points is defined as an atomic ratio of Al in the $Al_xTi_{1-x}N$. In doing so, a numerical value which seems to be an apparently unexpected value is excluded. Herein, "10 points selected as desired" are selected from different crystal grains of the first unit layer.

When the multilayer structure layer includes two or more first unit layers, then, initially, the above method is used to determine an atomic ratio of Al in each first unit layer and an average value of the atomic ratios of Al obtained from the first unit layers is defined as an atomic ratio of Al in the first unit layer. When the multilayer structure layer includes more than 10 first unit layers, any 10 first unit layers are selected and the above method is used to determine an atomic ratio of Al in each of the 10 first unit layers, and an average value of the atomic ratios of Al determined from the 10 first unit layers is defined as an atomic ratio of Al in the first unit layer.

In the present embodiment, the coating layer includes two or more multilayer structure layers. Accordingly, initially, the above method is used to determine an atomic ratio of Al of first unit layers in each multilayer structure layer and an average value of atomic ratios of Al obtained from the multilayer structure layers is defined as an atomic ratio x of Al in the first unit layers. When the coating layer includes more than 10 multilayer structure layers, any 10 multilayer structure layers are selected and the above method is used to determine an atomic ratio of Al of first unit layers in each of the 10 multilayer structure layers, and an average value of the atomic ratios of Al determined from the 10 multilayer structure layers is defined as an atomic ratio x of Al in the first unit layer.

The EDX device is JED-2300 (trade name) manufactured by JEOL Ltd., for example. Not only the atomic ratio of Al but those of Ti and N can also be calculated in the above method. The second unit layer and the lone layer described hereinafter can also have their atomic ratios of Al, Ti (titanium), and N (nitrogen) calculated in the above-described method.

The first unit layer includes cubic $Al_xTi_{1-x}N$ crystal grains. The first unit layer may further include hexagonal $Al_xTi_{1-x}N$ crystal grains insofar as it exhibits an effect of the present disclosure. The cubic $Al_xTi_{1-x}N$ crystal grains and the hexagonal $Al_xTi_{1-x}N$ crystal grains are identified by, for example, a pattern of a diffraction peak obtained through x-ray diffraction described hereinafter.

When a total amount of crystal grains of cubic $Al_xTi_{1-x}N$ (c) and crystal grains of hexagonal $Al_xTi_{1-x}N$ (h) serves as a reference, the crystal grains of hexagonal $Al_xTi_{1-x}N$ may be contained at a proportion (h/(c+h)) of 0% by volume or more and 15% by volume or less and may be 0% by volume or more and 10% by volume or less. The proportion can be determined for example by analyzing a pattern of a diffraction peak obtained through x-ray diffraction. A specific method is employed, as follows:

An X-ray spectrum of the first unit layer in a sample in the above-described cross section is obtained using an X-ray diffractometer ("MiniFlex600" (trade name) manufactured by Rigaku Corporation). The X-ray diffractometer is used for example under the following conditions:

Characteristic X-ray: Cu-Kα (wavelength: 1.54 angstrom)
Tube voltage: 45 kV
Tube current: 40 mA
Filter: Multi-layer mirror
Optical system: Focusing method
X-ray diffractometry: θ-2θ method In the obtained X-ray spectrum, cubic $Al_xTi_{1-x}N$'s peak intensity (Ic) and hexagonal $Al_xTi_{1-x}N$'s peak intensity (Ih) are measured. Herein, a "peak intensity" means a peak's height (cps) in the X-ray spectrum. Cubic $Al_xTi_{1-x}N$'s peak can be confirmed around diffraction angles $2\theta=38°$ and $44°$. Hexagonal $Al_xTi_{1-x}N$'s peak can be confirmed around a diffraction angle $2\theta=33°$. A peak intensity is a value excluding a background.

When a total amount of the cubic $Al_xTi_{1-x}N$ and the hexagonal $Al_xTi_{1-x}N$ serves as a reference, the hexagonal $Al_xTi_{1-x}N$ is contained at a proportion (vol %), as calculated by an expression indicated hereinafter. The cubic $Al_xTi_{1-x}N$'s peak intensity (Ic) is obtained by a sum of a peak intensity around $2\theta=38°$ and a peak intensity around $2\theta=44°$.

Proportion of the hexagonal $Al_xTi_{1-x}N$ contained (vol %)=$100\times\{Ih/(Ih+Ic)\}$ While a method for analyzing a crystal form of crystal grains in the first unit layer has been described above, a similar method can also be used to analyze a crystal form of crystal grains in each of the second unit layer and the lone layer described hereinafter.

The first unit layer has a thickness with an average value of 2.5 nm or more and 5 nm or less, preferably 3 nm or more and 5 nm or less. The first unit layer's average value in thickness can be determined as follows: a STEM is used to measure 10 points selected, as desired, in the same layer in a sample in a cross section parallel to the direction of a normal to a surface of the substrate and an average value of the measured 10 points in thickness is calculated to determine the first unit layer's average value in thickness. In doing so, a numerical value which seems to be an apparently unexpected value is excluded. When the multilayer structure layer includes two or more first unit layers, then, initially, the above method is used to determine an average value in thickness of each first unit layer and an average value of the determined values (that is, an average value of a plurality of first unit layers) is defined as an average value in thickness of the first unit layers in the multilayer structure layer. When the multilayer structure layer includes more than 10 first unit layers, any 10 first unit layers are selected and the above method is used to determine an average value in thickness of each of the 10 first unit layers, and an average value of the values determined from the 10 first unit layers is defined as an average value in thickness of the more than 10 first unit layers in the multilayer structure layer.

In the present embodiment, the coating layer includes two or more multilayer structure layers. Accordingly, initially, the above method is used to determine an average value in thickness of first unit layers in each multilayer structure layer and an average value of such average values obtained from the multilayer structure layers is defined as an average value in thickness of the first unit layers. When the coating layer includes more than 10 multilayer structure layers, any 10 multilayer structure layers are selected and the above method is used to determine an average value in thickness of first unit layers in each of the 10 multilayer structure layers, and an average value of such average values determined from the 10 multilayer structure layers is defined as an average value in thickness of the first unit layers. The same applies when measuring in thickness a second unit layer and a lone layer described hereinafter.

(Second Unit Layer)

The second unit layer includes cubic $Al_yTi_{1-y}N$ crystal grains. That is, the second unit layer is a layer including a polycrystal having a composition of $Al_yTi_{1-y}N$. An atomic ratio y of Al in the $Al_yTi_{1-y}N$ is 0.7 or more and less than 0.8, preferably 0.75 or more and less than 0.8. The atomic ratio y can be determined in a method similar to that described above, that is, by analyzing crystal grains in the second unit layer appearing in a sample in cross section with an EDX device accompanying a TEM.

The second unit layer includes cubic $Al_yTi_{1-y}N$ crystal grains. The second unit layer may further include hexagonal $Al_yTi_{1-y}N$ crystal grains insofar as it exhibits an effect of the present disclosure. The cubic $Al_yTi_{1-y}N$ crystal grains and the hexagonal $Al_yTi_{1-y}N$ crystal grains are identified by, for example, a pattern of a diffraction peak obtained through x-ray diffraction in a method similar to that described above.

When a total amount of crystal grains of cubic $Al_yTi_{1-y}N$ (c) and crystal grains of hexagonal $Al_yTi_{1-y}N$ (h) serves as a reference, the crystal grains of hexagonal $Al_yTi_{1-y}N$ may be contained at a proportion (h/(c+h)) of 0% by volume or more and 15% by volume or less and may be so at a proportion of 0% by volume or more and 10% by volume or less. The proportion can be determined for example by analyzing a pattern of a diffraction peak obtained through x-ray diffraction in a method similar to that described above.

The second unit layer has a thickness with an average value of 2.5 nm or more and 5 nm or less, preferably 3 nm or more and 5 nm or less. The second unit layer's average value in thickness can be determined with a STEM in a method similar to that described above.

(Lone Layer)

The lone layer includes cubic $Ti_zAl_{1-z}N$ crystal grains. That is, the lone layer is a layer including a polycrystal having a composition of $Ti_zAl_{1-z}N$. An atomic ratio z of Ti in the $Ti_zAl_{1-z}N$ is 0.4 or more and less than 0.55, preferably 0.4 or more and 0.5 or less. The lone layer having an atomic ratio z in the above range has a configuration having a higher atomic ratio of titanium than the multilayer structure layer does. When $Ti_zAl_{1-z}N$ crystal grains have an increased atomic ratio of titanium, the crystal grains have an increased hardness. The present inventors consider that when the lone layer is present in the coating layer at prescribed internals, the coating layer is enhanced in hardness and hence impact resistance. The atomic ratio z can be determined in a method similar to that described above, that is, by analyzing crystal grains in the lone layer appearing in the sample in cross section with an EDX device accompanying a TEM.

The lone layer includes cubic $Ti_zAl_{1-z}N$ crystal grains. The lone layer may further include hexagonal $Ti_zAl_{1-z}N$ crystal grains insofar as it exhibits an effect of the present disclosure. The cubic $Ti_zAl_{1-z}N$ crystal grains and the hexagonal $Ti_zAl_{1-z}N$ crystal grains are identified by a pattern of a diffraction peak obtained through x-ray diffraction in a method similar to that described above.

When a total amount of crystal grains of cubic $Ti_zAl_{1-z}N$ (c) and crystal grains of hexagonal $Ti_zAl_{1-z}N$ (h) serves as a reference, the crystal grains of hexagonal $Ti_zAl_{1-z}N$ may be contained at a proportion (h/(c+h)) of 0% by volume or more and 15% by volume or less, and may be so at a proportion of 0% by volume or more and 10% by volume or less. The proportion can be determined by analyzing a pattern of a diffraction peak obtained through x-ray diffraction in a method similar to that described above.

The lone layer has a thickness with an average value of 2.5 nm or more and 10 nm or less, preferably 2.5 nm or more and 5 nm or less. The lone layer's average value in thickness can be determined with a STEM in a method similar to that described above.

(Repetitive Unit of Multilayer Structure Layer and Lone Layer)

One multilayer structure layer and one lone layer form a repetitive unit having a thickness with an average value of 50 nm or more and 100 nm or less, a maximum value of 90 nm or more and 110 nm or less, and a minimum value of 40 nm or more and 60 nm or less. The coating layer according to the present embodiment is formed by alternately stacking the multilayer structure layer and the lone layer, and a combination of one multilayer structure layer and one lone layer adjacent to each other will be hereinafter referred to as a "repetitive unit composed of one multilayer structure layer and one lone layer" or simply a "repetitive unit." In the repetitive unit, the layers are stacked in the following order: as seen at the substrate, the lone layer is deposited and thereon the multilayer structure layer is deposited. A "thickness of the repetitive unit" means a sum in thickness of a multilayer structure layer and a lone layer configuring a repetitive unit. Note that when the coating layer has a lowermost layer which is the multilayer structure layer, the multilayer structure layer of the lowermost layer is not considered in determining the repetitive unit's average, maximum and minimum values in thickness described hereinafter.

Conventionally, attempts have been made to improve cutting tools in cutting performance by forming a layer that configures a coating in a multilayer structure. However, optimal cutting performance required varies depending on the material of the workpiece to be cut, and there has been a demand for further improvement of cutting tools. Under such circumstances, the present inventors have diligently conducted studies, and as a result found that a cutting tool's various characteristics (for example, impact resistance, oxidation resistance, wear resistance, thermal crack resistance, and the like) can be adjusted by varying the lone layer and the repetitive unit in thickness.

The cutting tool according to the present embodiment has the repetitive unit configured as described above, and can thus have excellent impact resistance and excellent oxidation resistance. The cutting tool is particularly suitable as a cutting tool used for high-speed processing of stainless steel (e.g., SUS304).

The repetitive unit has a thickness with an average value of 50 nm or more and 100 nm or less, preferably 55 nm or more and 95 nm or less. The repetitive unit's average value in thickness can be determined by a sum of an average value in thickness of the multilayer structure layer and an average value in thickness of the lone layer. When the coating layer includes more than 10 repetitive units, 10 successive repetitive units are selected in the coating layer, and an average value of the selected 10 repetitive units is defined as an average value in thickness of the more than 10 repetitive units. In doing so, the 10 layers are selected such that the interface between the fourth layer and the fifth layer in the selected 10 layers is closest to the center of the coating layer.

The repetitive unit has a thickness with a maximum value of 90 nm or more and 110 nm or less, preferably 90 nm or more and 100 nm or less. The maximum value in thickness can be determined in the following method: Initially, a method similar to that describe above is used to determine a thickness of each repetitive unit in a sample in the above-described cross section with a STEM. Subsequently, the repetitive units are compared in thickness and a maximum value thereof is defined as a maximum value in thickness of the repetitive units. When the coating layer includes more than 10 repetitive units, 10 successive repetitive units are selected in the coating layer, and a maximum value in the selected 10 repetitive units is defined as a maximum value in thickness of the more than 10 repetitive units. In doing so, the 10 layers are selected such that the interface between the fourth layer and the fifth layer in the selected 10 layers is closest to the center of the coating layer. In comparing repetitive units in thickness, a numerical value which seems to be an apparently unexpected value is excluded.

The repetitive unit has a thickness with a minimum value of 40 nm or more and 60 nm or less, preferably 50 nm or more and 60 nm or less. The minimum value in thickness can be determined in the following method: Initially, a method similar to that describe above is used to determine a thickness of each repetitive unit in a sample in the above-described cross section with a STEM. Subsequently, the repetitive units are compared in thickness and a minimum value thereof is defined as a minimum value in thickness of the repetitive units. When the coating layer includes more than 10 repetitive units, 10 successive repetitive units are selected in the coating layer, and a minimum value of the selected 10 repetitive units is defined as a minimum value in thickness of the more than 10 repetitive units. In doing so, the 10 layers are selected such that the interface between the fourth layer and the fifth layer in the selected 10 layers is closest to the center of the coating layer. In comparing repetitive units in thickness, a numerical value which seems to be an apparently unexpected value is excluded.

In one aspect of the present embodiment, the repetitive unit preferably has a thickness with an average value of 55 nm or more and 95 nm or less, a maximum value of 90 nm or more and 100 nm or less, and a minimum value of 50 nm or more and 60 nm or less.

(Underlying Layer)

Preferably, the coating further includes an underlying layer provided between the substrate and the coating layer, and the underlying layer is composed of a compound consisting of at least one element selected from the group consisting of a group 4 element, a group 5 element and a group 6 element of the periodic table and aluminum (Al) and at least one element selected from the group consisting of carbon, nitrogen, oxygen and boron. The underlying layer is different in composition from the first unit layer, the second unit layer, and the lone layer. Examples of the group 4 element of the periodic table include titanium (Ti), zirconium (Zr), hafnium (Hf), and the like. Examples of the group 5 element of the periodic table include vanadium (V), niobium (Nb), tantalum (Ta), and the like. Examples of the group 6 element of the periodic table include chromium (Cr), molybdenum (Mo), tungsten (W), and the like. The underlying layer is preferably composed of a compound represented by TiN or TiCN. Such an underlying layer exhibits strong adhesion to both the coating layer and the substrate. As a result, the coating is enhanced in peeling resistance.

The underlying layer preferably has a thickness with an average value of 0.1 μm or more and 20 μm or less, more preferably 1 μm or more and 15 μm or less. Such a thickness can be confirmed by observing a vertical cross section of the substrate and the coating with a STEM in a method similar to that described above.

(Surface Layer)

Preferably, the coating further includes a surface layer provided on the coating layer and the surface layer is composed of a compound consisting of at least one element selected from the group consisting of a group 4 element, a group 5 element and a group 6 element of the periodic table and aluminum (Al) and at least one element selected from the group consisting of carbon, nitrogen, oxygen and boron. The surface layer is different in composition from the first unit layer, the second unit layer, and the lone layer. The compound included in the surface layer includes TiN, $Al_2O_3$ and AlN for example.

The surface layer preferably has a thickness with an average value of 0.1 μm or more and 3 μm or less, more preferably 0.3 μm or more and 2 μm or less. Such a thickness can be confirmed by observing a vertical cross section of the substrate and the coating with a STEM in a method similar to that described above.

(Another Layer)

The coating may further include another layer insofar as the cutting tool according to the present embodiment exhibits the above-described effect. The other layer may have a composition different from or identical to that of the coating layer, the underlying layer, or the surface layer. Examples of a compound included in the other layer include TiN, TiCN, TiBN, and $Al_2O_3$. The other layer is not limited, either, in in what order it is stacked. For example, the other layer may be provided between the underlying layer and the coating layer. While the other layer is not particularly limited in thickness as long as it exhibits an effect of the present embodiment, it is for example 0.1 μm or more and 20 μm or less.

<<Method for Manufacturing the Cutting Tool>>

A method for manufacturing a cutting tool according to the present embodiment comprises:

preparing the substrate (hereinafter also simply referred to as a "first step"); and forming the coating layer on the substrate through chemical vapor deposition (hereinafter also simply referred to as a "second step"), the step of forming the coating layer on the substrate including jetting a first gas, a second gas and a third gas onto the substrate in an atmosphere of 650° C. or higher and 900° C. or lower and 0.5 kPa or higher and 30 kPa or lower, the first gas including a gas of a halide of aluminum and a gas of a halide of titanium, the second gas including a gas of a halide of aluminum, a gas of a halide of titanium and a gas of ammonia, the third gas including a gas of ammonia.

<First Step: Step of Preparing a Substrate>

In the first step, a substrate is prepared. For example, a cemented carbide substrate is prepared as the substrate. The cemented carbide substrate may be a commercially available product or may be manufactured in a typical powder metallurgy method. When the substrate is manufactured in a typical powder metallurgy method, for example, WC powder and Co powder or the like are mixed using a ball mill or the like to obtain a powdery mixture. After the powdery mixture is dried, it is shaped into a prescribed shape (for example, SEET13T3AGSN-G, etc.) to obtain a shaped body. The shaped body is sintered to obtain a WC-Co based cemented carbide (a sintered material). Subsequently, the sintered material can be honed or subjected to a prescribed cutting edge process to prepare a substrate made of the WC-Co based cemented carbide. In the first step, any other substrate may be prepared insofar as it is a substrate conventionally known as a substrate of this type.

<Second Step: Forming the Coating Layer on the Substrate Through Chemical Vapor Deposition>

In the second step, the coating layer is formed on the substrate through chemical vapor deposition. More specifically, in the second step, a first gas, a second gas and a third gas are jetted onto the substrate in an atmosphere of 650° C. or higher and 900° C. or lower and 0.5 kPa or higher and 30 kPa or lower, the first gas including a gas of a halide of aluminum and a gas of a halide of titanium, the second gas including a gas of a halide of aluminum, a gas of a halide of titanium and a gas of ammonia, the third gas including a gas of ammonia. This step can be performed using, for example, a CVD apparatus described below.

(CVD Apparatus)

Figure 4:
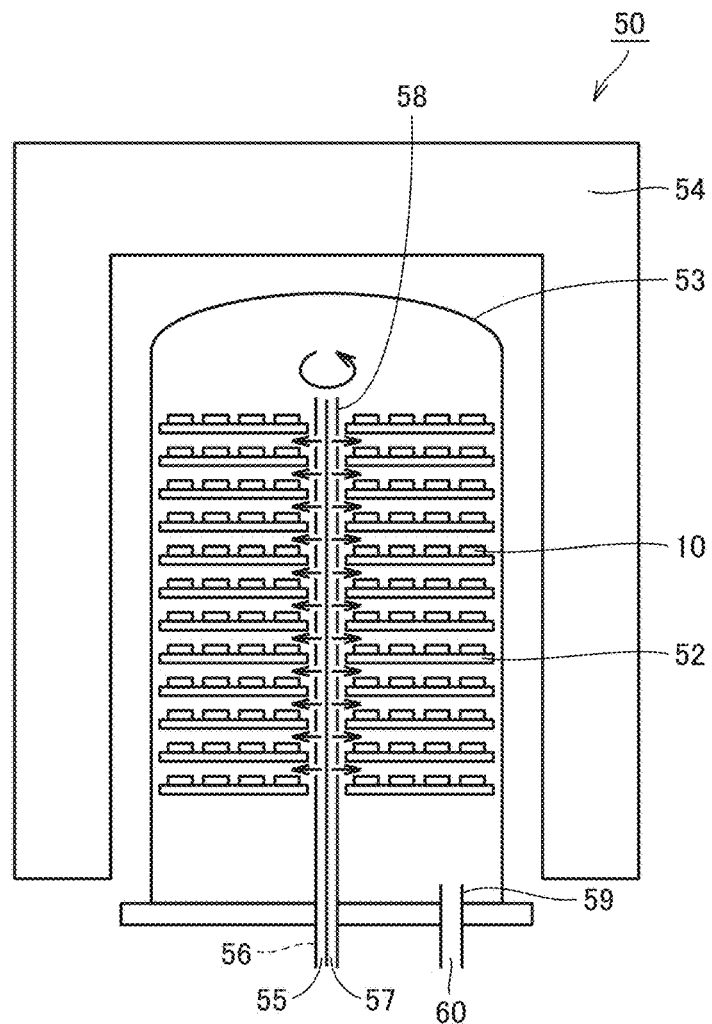
FIG. 4 is a schematic cross section of a CVD apparatus used for manufacturing the cutting tool according to the present embodiment.

FIG. 4 is a schematic cross section of one example of a CVD apparatus used for manufacturing the cutting tool according to the present embodiment. As shown in FIG. 4, a CVD apparatus 50 includes a plurality of substrate setting jigs 52 for setting substrate 10, and a reaction chamber 53 made of heat-resistant alloy steel and incorporating substrate setting jigs 52 therein. A temperature controller 54 is provided around reaction chamber 53 for controlling the temperature inside reaction chamber 53. In the present embodiment, for example, substrate 10 is preferably set on a plate included in substrate setting jig 52.

Figure 5:
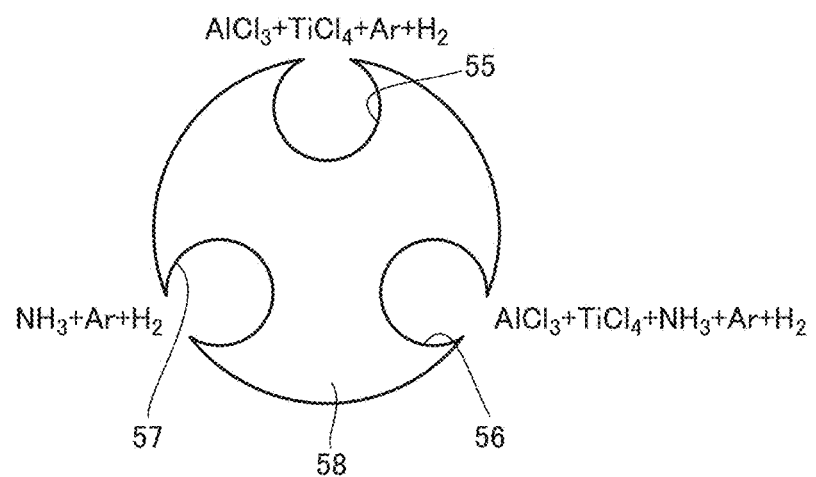
FIG. 5 is a schematic cross section of a gas introduction pipe of the CVD apparatus used in manufacturing the cutting tool according to the present embodiment.

A gas introduction pipe 58 having a first gas introduction pipe 55, a second gas introduction pipe 56 and a third gas introduction pipe 57 adjacently bonded together extends in the vertical direction through a space inside reaction chamber 53 rotatably about the vertical direction. Gas introduction pipe 58 is configured such that the first gas introduced into first gas introduction pipe 55, the second gas introduced into second gas introduction pipe 56, and the third gas introduced into third gas introduction pipe 57 are not mixed together inside gas introduction pipe 58 (see FIG. 5). Further, first gas introduction pipe 55, second gas introduction pipe 56, and third gas introduction pipe 57 are each provided with a plurality of throughholes for jetting the gases respectively flowing through first, second and third gas introduction pipes 55, 56 and 57 onto substrate 10 set on substrate setting jig 52. In the present embodiment, the gas jetting through hole is preferably set in number such that one through hole is associated with one substrate setting jig 52. The through hole thus set allows the lone layer and the repetitive unit to be deposited as desired in thickness.

Further, reaction chamber 53 is provided with a gas exhaust pipe 59 for externally exhausting the gas inside reaction chamber 53, and the gas in reaction chamber 53 passes through gas exhaust pipe 59 and is exhausted out of reaction chamber 53 via a gas exhaust port 60.

More specifically, the first gas, the second gas and the third gas are introduced into first gas introduction pipe 55, second gas introduction pipe 56 and third gas introduction pipe 57, respectively. In doing so, the first, second and third gases in their respective gas introduction pipes may have any temperature that does not liquefy the gases. Subsequently, the first gas, the second gas and the third gas are jetted in this order repeatedly into reaction chamber 53 with an atmosphere set therein to have a temperature of 650° C. or higher and 900° C. or lower (preferably 700° C. or higher and 780° C. or lower) and a pressure of 0.5 kPa or higher and 30 kPa or lower (preferably 2 kPa or higher and 5 kPa or lower). As gas introduction pipe 58 has the plurality of throughholes, the first, second, and third gases introduced are jetted into reaction chamber 53 through different throughholes, respectively. While the gases are thus jetted, gas introduction pipe 58 is rotating at a rotation speed for example of 2 to 4 rpm about the above-described axis, as indicated in FIG. 4 by a rotating arrow. As a result, the first gas, the second gas, and the third gas can be jetted in this order repeatedly onto substrate 10.

(First Gas)

The first gas includes a gas of a halide of aluminum and a gas of a halide of titanium.

Examples of the gas of a halide of aluminum include a gas of aluminum chloride (a gas of $AlCl_3$ and a gas of $Al_2Cl_6$). Preferably, a gas of $AlCl_3$ is used. The gas of a halide of aluminum preferably has a concentration (% by volume) of 0.3% by volume or more and 1.5% by volume or less, more preferably 0.8% by volume or more and 0.87% by volume or less with reference to the total volume of the first gas.

Examples of the gas of a halide of titanium include a gas of titanium (IV) chloride (a gas of TiCl$_4$), a gas of titanium (III) chloride (a gas of TiCl$_3$), and the like. Preferably a gas of titanium (IV) chloride is used. The gas of a halide of titanium preferably has a concentration (in % by volume) of 0.1% by volume or more and 1% by volume or less, more preferably 0.1% by volume or more and 0.2% by volume or less with reference to the total volume of the first gas.

In the first gas, the gas of a halide of aluminum has a molar ratio preferably of 0.5 or more and 0.9 or less, more preferably 0.8 or more and 0.87 or less with reference to the total moles of the gas of a halide of aluminum and the gas of a halide of titanium.

The first gas may include a gas of hydrogen and may include an inert gas such as a gas of argon. The inert gas preferably has a concentration (% by volume) of 5% by volume or more and 70% by volume or less, more preferably 20% by volume or more and 60% by volume or less, still more preferably 20% by volume or more and 30% by volume or less with reference to the total volume of the first gas. The gas of hydrogen typically occupies the balance of the first gas.

The first gas is jetted onto the substrate at a flow rate preferably of 20 to 50 L/min., more preferably 40 to 50 L/min.

(Second Gas)

The second gas includes a gas of a halide of aluminum, a gas of a halide of titanium, and a gas of ammonia. The gas of a halide of aluminum and the gas of a halide of titanium can be the gases exemplified in the above (First Gas) section. The gas of a halide of aluminum and the gas of a halide of titanium that are used for the first gas may be identical to or different from the gas of a halide of aluminum and the gas of a halide of titanium that are used for the second gas, respectively.

The gas of a halide of aluminum preferably has a concentration (% by volume) of 2% by volume or more and 5% by volume or less, more preferably 2% by volume or more and 3.25% by volume or less with reference to the total volume of the second gas.

The gas of a halide of titanium preferably has a concentration (in % by volume) of 0.1% by volume or more and 3% by volume or less, more preferably 1.75% by volume or more and 3% by volume or less with reference to the total volume of the second gas.

In the second gas, the gas of a halide of aluminum has a molar ratio preferably exceeding 0.35 and less than 0.7, more preferably 0.4 or more and 0.65 or less with reference to the total moles of the gas of a halide of aluminum and the gas of a halide of titanium.

The gas of ammonia preferably has a concentration (% by volume) of 5% by volume or more and 15% by volume or less, more preferably 9% by volume or more and 11% by volume or less with reference to the total volume of the second gas.

The second gas may include a gas of hydrogen and may include an inert gas such as a gas of argon. The inert gas preferably has a concentration (% by volume) of 5% by volume or more and 50% by volume or less, more preferably 15% by volume or more and 17% by volume or less with reference to the total volume of the second gas.

The gas of hydrogen typically occupies the balance of the second gas.

The second gas is jetted onto the substrate at a flow rate preferably of 20 to 40 L/min.

(Third Gas)

The third gas includes a gas of ammonia. The third gas may include a gas of hydrogen and may include an inert gas such as a gas of argon.

The gas of ammonia preferably has a concentration (% by volume) of 2% by volume or more and 30% by volume or less, more preferably 2% by volume or more and 10% by volume or less with reference to the total volume of the third gas. The gas of hydrogen typically occupies the balance of the third gas.

The third gas is jetted onto the substrate at a flow rate preferably of 10 to 20 L/min.

<Another Step>

In the manufacturing method according to the present embodiment, in addition to the steps described above, an additional step may be performed, as appropriate, insofar as the method exhibits an effect of the present embodiment. Examples of the additional step include the step of forming an underlying layer between the substrate and the coating layer, the step of forming a surface layer on the coating layer, the step of blasting the coating, and the like. The underlying layer and the surface layer may be formed in any method, and the layers are formed for example through CVD.

In the method for manufacturing a surface-coated cutting tool according to the present embodiment, the coating layer is formed through CVD. When this is compared with forming the coating through PVD, the former enhances the coating's adhesion to the substrate (or coating adhesion).

Examples

Hereinafter, the present invention will more specifically be described with reference to examples although the present invention is not limited thereto.

<<Manufacturing a Cutting Tool>>

<Preparing a Substrate>

Initially, as a substrate on which a coating is to be formed, a substrate composed of cemented carbide indicated in Table 1 below (hereinafter also simply referred to as a "substrate") was prepared (i.e., a first step). Specifically, initially, powdery raw materials of a blending composition (% by mass) shown in Table 1 were uniformly mixed. In Table 1, "balance" indicates that WC occupies the balance of the blending composition (% by mass).

TABLE 1

| | blending composition (mass %) | | | | |
|---|---|---|---|---|---|
| type | Co | TiC | Cr$_3$C$_2$ | TaC | WC |
| substrate | 12.0 | 1 | 0.3 | 0.5 | balance |

Subsequently, the powdery mixture was pressure-formed into a prescribed shape and thereafter sintered for 1 to 2 hours at 1300 to 1500° C. to obtain the above substrate (substrate shape (JIS standard): SEET13T3AGSN-G). SEET13T3AGSN-G is a shape of an indexable cutting insert for a rotating tool.

<Depositing the Coating>

A coating was deposited on a surface of the substrate by depositing the underlying layer, the coating layer and the surface layer shown in Table 8 on the surface of the substrate. The coating was deposited mainly through CVD. Hereinafter, a method for depositing each layer constituting the coating will be described.

(Depositing the Coating Layer)

Under the conditions shown in Table 2 for deposition, a first gas, a second gas, and a third gas having the compositions shown in Tables 3, 4 and 5, respectively, were jetted in this order repeatedly onto a surface of the substrate to form a coating layer (a second step). In doing so, the substrate was set on a plate included in the substrate setting jig. Further, the gas jetting through hole was set in number such that one through hole was associated with one substrate setting jig. When an underlying layer was provided on a surface of the substrate, the coating layer was formed on a surface of the underlying layer.

For example, a coating layer indicated in Table 6-1 by an identification symbol [1] was deposited as follows: with a temperature of 780° C., a pressure of 3 kPa, and the gas introduction pipe having a rotational speed of 2 rpm set as conditions for deposition (as indicated in Table 2 by an identification symbol 2-a), a first gas indicated in Table 3 by an identification symbol 3-b (0.85% by volume of $AlCl_3$, 0.15% by volume of $TiCl_4$, 30% by volume of Ar, and a balance of $H_2$, with a gas flow rate of 50 L/min), a second gas indicated in Table 4 by an identification symbol 4-b (2% by volume of $AlCl_3$, 3% by volume of $TiCl_4$, 9% by volume of $NH_3$, 15% by volume of Ar, and a balance of $H_2$, with a gas flow rate of 40 L/min), and a third gas indicated in Table 5 by an identification symbol 5-a (3% by volume of $NH_3$, and a balance is $H_2$, with a gas flow rate of 20 L/min) were jetted in this order repeatedly onto a surface of the substrate to deposit the coating layer. A coating layer indicated in Table 6-2 by an identification symbol [20] was deposited in a known PVD method. Deposited coating layers each have a composition and the like, as shown in Tables 6-1 and 6-2.

TABLE 2 conditions for deposition

| ID symbol | 2-a |
|---|---|
| temperature (° C.) | 780 |
| pressure (kPa) | 3 |
| rotational speed (rpm) | 2 |

TABLE 3 composition of 1st gas

| ID symbol | 3-a | 3-b | 3-c | 3-d | 3-e | 3-f | 3-g | 3-h |
|---|---|---|---|---|---|---|---|---|
| $AlCl_3$ (vol %) | 0.85 | 0.85 | 0.85 | 0.85 | 0.85 | 0.85 | 0.85 | 0.85 |
| $TiCl_4$ (vol %) | 0.15 | 0.15 | 0.15 | 0.15 | 0.15 | 0.15 | 0.15 | 0.15 |
| $AlCl_3/(AlCl_3 + TiCl_4)$ (molar ratio) | 0.85 | 0.85 | 0.85 | 0.85 | 0.85 | 0.85 | 0.85 | 0.85 |
| Ar (vol %) | 30 | 30 | 25 | 20 | 20 | 15 | 15 | 10 |
| $H_2$ (vol %) | balance | balance | balance | balance | balance | balance | balance | balance |
| gas flow rate (L/min) | 55 | 50 | 40 | 40 | 35 | 35 | 30 | 20 |

TABLE 4 composition of 2nd gas

| ID symbol | 4-a | 4-b | 4-c | 4-d | 4-e | 4-f | 4-g | 4-h |
|---|---|---|---|---|---|---|---|---|
| $AlCl_3$ (vol %) | 1.75 | 2 | 2.25 | 2.5 | 2.75 | 3 | 3.25 | 3.5 |
| $TiCl_4$ (vol %) | 3.25 | 3 | 2.75 | 2.5 | 2.25 | 2 | 1.75 | 1.5 |
| $AlCl_3/(AlCl_3 + TiCl_4)$ (molar ratio) | 0.35 | 0.4 | 0.45 | 0.5 | 0.55 | 0.6 | 0.65 | 0.7 |
| $NH_3$ (vol %) | 9 | 9 | 9 | 9 | 9 | 9 | 9 | 9 |
| Ar (vol %) | 15 | 15 | 15 | 15 | 15 | 15 | 15 | 15 |
| $H_2$ (vol %) | balance | balance | balance | balance | balance | balance | balance | balance |
| gas flow rate (L/min) | 40 | 40 | 40 | 40 | 40 | 40 | 40 | 40 |

TABLE 5 composition of 3rd gas

| ID symbol | 5-a |
|---|---|
| $NH_3$ (vol %) | 3 |
| $H_2$ (vol %) | balance |
| gas flow rate (L/min) | 20 |

TABLE 6-1

| | | | repetitive unit | | | | | | | | |
|---|---|---|---|---|---|---|---|---|---|---|---|
| | | | multilayer structure layer | | | | | | lone layer | | |
| | ID | ID | 1st unit layer | | | 2nd unit layer | | | total | | |
| ID symbol | symbol in table 3 | symbol in table 4 | h/(c + h) (vol %) | atomic ratio x of Al in $Al_xTi_{1-x}N$ | thickness* (nm) | h/(c + h) (vol %) | atomic ratio y of Al in $Al_yTi_{1-y}N$ | thickness* (nm) | thickness* (nm) | h/(c + h) (vol %) | atomic ratio z of Ti in $Ti_zAl_{1-z}N$ | thickness* (nm) |
| [1] | 3-b | 4-b | 2 | 0.84 | 2.7 | 3 | 0.71 | 2.8 | 45.8 | 2 | 0.42 | 5.9 |
| [2] | 3-c | 4-b | 4 | 0.87 | 3.2 | 3 | 0.77 | 3.4 | 54.7 | 4 | 0.44 | 3 |
| [3] | 3-d | 4-b | 3 | 0.83 | 2.6 | 2 | 0.73 | 2.6 | 43.3 | 3 | 0.45 | 6.1 |
| [4] | 3-b | 4-c | 4 | 0.89 | 3.5 | 2 | 0.79 | 3.5 | 57.9 | 2 | 0.45 | 3.2 |
| [5] | 3-c | 4-c | 2 | 0.91 | 4 | 4 | 0.78 | 4.1 | 66.8 | 2 | 0.47 | 4.4 |
| [6] | 3-d | 4-c | 2 | 0.92 | 4.4 | 3 | 0.77 | 4.3 | 71.7 | 4 | 0.48 | 3.8 |
| [7] | 3-b | 4-d | 4 | 0.92 | 4.3 | 2 | 0.74 | 4.5 | 72.5 | 2 | 0.51 | 6.5 |
| [8] | 3-c | 4-d | 3 | 0.93 | 4.7 | 2 | 0.77 | 4.8 | 78.2 | 4 | 0.49 | 4.8 |
| [9] | 3-d | 4-d | 2 | 0.91 | 4.1 | 4 | 0.73 | 3.9 | 66.0 | 3 | 0.54 | 8.2 |

*average value in thickness

TABLE 6-2

| | | | repetitive unit | | | | | | | | |
|---|---|---|---|---|---|---|---|---|---|---|---|
| | | | multilayer structure layer | | | | | | lone layer | | |
| | ID | ID | 1st unit layer | | | 2nd unit layer | | | total | | |
| ID symbol | symbol in table 3 | symbol in table 4 | h/(c + h) (vol %) | atomic ratio x of Al in $Al_xTi_{1-x}N$ | thickness* (nm) | h/(c + h) (vol %) | atomic ratio y of Al in $Al_yTi_{1-y}N$ | thickness* (nm) | thickness* (nm) | h/(c + h) (vol %) | atomic ratio z of Ti in $Ti_zAl_{1-z}N$ | thickness* (nm) |
| [10] | 3-b | 4-a | 3 | 0.83 | 2.9 | 2 | 0.73 | 2.7 | 46.6 | 2 | 0.35 | 6.6 |
| [11] | 3-d | 4-a | 2 | 0.84 | 3.1 | 2 | 0.74 | 3 | 50.6 | 3 | 0.38 | 7.9 |
| [12] | 3-a | 4-b | 4 | 0.83 | 2.4 | 2 | 0.73 | 2.3 | 39.3 | 2 | 0.43 | 5.2 |
| [13] | 3-e | 4-b | 2 | 0.87 | 5.1 | 2 | 0.77 | 5.5 | 98.1 | 2 | 0.43 | 10.9 |
| [14] | 3-a | 4-d | 3 | 0.89 | 2.1 | 3 | 0.78 | 1.9 | 33.6 | 3 | 0.43 | 4.7 |
| [15] | 3-e | 4-d | 4 | 0.89 | 5.3 | 2 | 0.77 | 5.6 | 102.5 | 4 | 0.43 | 11.3 |
| [16] | 3-b | 4-e | 4 | 0.91 | 3.2 | 4 | 0.79 | 3.5 | 55.5 | 4 | 0.57 | 4.2 |
| [17] | 3-d | 4-e | 2 | 0.92 | 3.1 | 3 | 0.79 | 3.9 | 57.9 | 2 | 0.59 | 4.6 |
| [18] | — | 4-c | 2 | 0.87 | 4.1 | 3 | 0.78 | 3.2 | 5000 | | absent | |
| [19] | 3-c | — | | absent | | | | | | 3 | 0.52 | 5000 |
| [20]** | — | — | 4 | 0.63 | 3.3 | 3 | 0.6 | 4.9 | 5000 | | absent | |

*average value in thickness
**deposited through known PVD.

(Depositing an Underlying Layer and Depositing a Surface Layer)

Under conditions indicated in Table 7 for deposition, a reactant gas having a composition indicated in Table 7 was jetted onto a surface of the substrate to deposit an underlying layer. Under conditions indicated in Table 7 for deposition, a reactant gas having a composition indicated in Table 7 was jetted onto a surface of the coating layer to deposit a surface layer.

Cutting tools according to the present example were thus manufactured through the above process. The cutting tools of Sample Nos. 1-3 and 2 to 20 include a substrate, a coating layer provided on the substrate, and an underlying layer provided between the substrate and the coating layer (see table 8). The cutting tools of Sample Nos. 1-1 and 1-2 include a substrate, an coating layer provided on the substrate, an underlying layer provided between the substrate and the coating layer, and a surface layer provided on the coating layer (see table 8).

TABLE 7

| | | conditions for deposition | | |
|---|---|---|---|---|
| type | composition of reactant gas (vol %) | pressure (kPa) | temperature (° C.) | gas flow rate (L/min) |
| TiN | $TiCl_4$ = 0.5%, $N_2$ = 41.2%, $H_2$ = balance | 79.8 | 780 | 45.9 |
| TiCN | $TiCl_4$ = 2.0%, $CH_3CN$ = 0.7%, $H_2$ = balance | 9 | 860 | 50.5 |
| $Al_2O_3$ | $AlCl_3$ = 1.6%, $CO_2$ = 4.5%, $H_2S$ = 0.2%, $NO_2$ = 0.5%, $H_2$ = balance | 6.7 | 850 | 46.2 |

<<Evaluating Characteristics of Cutting Tools>>

Using the cutting tools of the samples manufactured as described above, the cutting tools' characteristics were evaluated as follows: The cutting tools of Sample Nos. 1-1 to 1-3 and 2 to 9 correspond to examples. The cutting tools of Sample Nos. 10 to 20 correspond to comparative examples.

<Measuring Thickness of Coating and the Like>

The coating and the underlying, coating and surface layers constituting the coating were measured in thickness by measuring each layer at any 10 points selected, as desired, in a sample in a cross section parallel to the direction of a normal to a surface of the substrate with a scanning transmission electron microscope (STEM) (manufactured by JEOL Ltd., trade name: JEM-2100F), and calculating an average value in thickness of the measured 10 points. A result is shown in Table 8. In the "surface layer" column, "-" indicates that the surface layer does not exist in the coating. Furthermore, in the "coating layer" column, an indication such as "[1] (3.6)" indicates that a coating layer has a configuration indicated in Table 6-1 by identification symbol [1] and has a thickness of 3.6 μm. In Table 8, an indication such as "TiCN (0.5)" indicates that the corresponding layer is a TiCN layer having a thickness of 0.5 μm. Two compounds indicated in a single cell (for example, "$Al_2O_3$ (0.2)–TiN (0.1)") indicate that the compound on the left side ($Al_2O_3$ (0.2)) is a layer located on a side closer to a surface of the substrate and the compound on the right side (TiN (0.1)) is a layer located on a side farther from the surface of the substrate. Furthermore, an indication such as "[$Al_2O_3$ (0.2)–TiN (0.1)]×3" or the like means that a layer represented by "$Al_2O_3$ (0.2)–TiN (0.1)" is deposited three times repeatedly.

TABLE 8

| | coating's configuration & each layer's thickness | | | |
|---|---|---|---|---|
| sample nos. | underlying layer (μm) | coating layer (μm) | surface layer (μm) | total coating thickness (μm) |
| 1-1 | TiCN (0.5) | [1] (3.6) | [$Al_2O_3$(0.2)—TiN(0.1)] × 3 | 5.0 |
| 1-2 | TiCN (0.5) | [1] (4.5) | $Al_2O_3$(0.5) | 5.5 |
| 1-3 | TiCN (1.0) | [1] (5.0) | — | 6.0 |
| 2 | TiCN (1.0) | [2] (5.0) | — | 6.0 |
| 3 | TiCN (1.0) | [3] (5.0) | — | 6.0 |
| 4 | TiCN (1.0) | [4] (5.0) | — | 6.0 |
| 5 | TiCN (1.0) | [5] (5.0) | — | 6.0 |
| 6 | TiCN (1.0) | [6] (5.0) | — | 6.0 |
| 7 | TiCN (1.0) | [7] (5.0) | — | 6.0 |
| 8 | TiCN (1.0) | [8] (5.0) | — | 6.0 |
| 9 | TiCN (1.0) | [9] (5.0) | — | 6.0 |
| 10 | TiCN (1.0) | [10] (5.0) | — | 6.0 |
| 11 | TiCN (1.0) | [11] (5.0) | — | 6.0 |
| 12 | TiCN (1.0) | [12] (5.0) | — | 6.0 |
| 13 | TiCN (1.0) | [13] (5.0) | — | 6.0 |
| 14 | TiCN (1.0) | [14] (5.0) | — | 6.0 |
| 15 | TiCN (1.0) | [15] (5.0) | — | 6.0 |
| 16 | TiCN (1.0) | [16] (5.0) | — | 6.0 |
| 17 | TiCN (1.0) | [17] (5.0) | — | 6.0 |
| 18 | TiCN (1.0) | [18] (5.0) | — | 6.0 |
| 19 | TiCN (1.0) | [19] (5.0) | — | 6.0 |
| 20 | TiCN (1.0) | [20] (5.0) | — | 6.0 |

<Analyzing Multilayer Structure Layer and Lone Layer in Composition>

The multilayer structure layer (the first unit layer and the second unit layer) and the lone layer had their compositions determined in the above-described method by analyzing crystal grains in each layer appearing in a sample in the above-described cross section with an EDX device accompanying a TEM (JED-2300 (trade name) manufactured by JEOL Ltd.). A result is shown in Tables 6-1 and 6-2.

<Analyzing Crystal Form of Multilayer Structure Layer and Lone Layer>

The multilayer structure layer (the first unit layer and the second unit layer) and the lone layer had their crystal forms determined by analyzing a pattern of a diffraction peak obtained through x-ray diffraction in the above described method. This was done using an X-ray diffractometer "MiniFlex600" (trade name) manufactured by Rigaku Corporation. The X-ray diffractometer was used under the following conditions. Tables 6-1 and 6-2 show a proportion (h/(c+h)) of hexagonal crystal grains contained with reference to a total amount of cubic crystal grains (c) and hexagonal crystal grains (h), as determined in each layer.

Characteristic X-ray: Cu-Kα (wavelength: 1.54 angstrom)
Tube voltage: 45 kV
Tube current: 40 mA
Filter: Multi-layer mirror
Optical system: Focusing method
X-ray diffractometry: θ-2θ method <Thickness of Multilayer Structure Layer and Lone Layer>

The multilayer structure layer (the first unit layer and the second unit layer) and the lone layer were determined in thickness in the following procedure: Initially, each layer was determined in thickness by measuring each layer at any 10 points selected, as desired, in a sample in a cross section parallel to the direction of a normal to a surface of the substrate with a scanning transmission electron microscope (STEM) (manufactured by JEOL Ltd., trade name: JEM-2100F), and calculating an average value in thickness of the measured 10 points.

When the multilayer structure layer included two or more first unit layers, then, initially, the above method was used to determine an average value in thickness of each first unit layer and an average value of the determined values was defined as an average value in thickness of the first unit layers in the multilayer structure layer. When the multilayer structure layer included more than 10 first unit layers, then in the first unit layers at 10 locations selected as desired, the above method was used to determine an average value in thickness of a first unit layer at each of the 10 locations and an average value of such determined values was defined as an average value in thickness of the more than 10 first unit layers in the multilayer structure layer. Further, as the coating layer includes two or more multilayer structure layers, average values in thicknesses of the first unit layers obtained from the multilayer structure layers were further averaged to obtain an average value in thicknesses of the first unit layers. When the coating layer included more than 10 multilayer structure layers, any 10 multilayer structure layers were selected and the above method was used to determine an average value in thickness of first unit layers in each of the 10 multilayer structure layers, and an average value of such average values determined from the 10 multilayer structure layers was defined as an average value in thickness of the first unit layers. The second unit layer's average value in thickness was also determined in a similar manner. The coating layer includes two or more lone layers. Accordingly, average values in thickness determined from the lone layers were further averaged to obtain a value, which served as an average value in thicknesses of the lone layers. A result is shown in Tables 6-1 and 6-2.

<Average, Maximum and Minimum Values in Thickness of Repetitive Unit>

The repetitive unit composed of one multilayer structure layer and one lone layer (hereinafter referred to as a "repetitive unit") had average value, maximum and minimum values in thickness, as determined in the following method: In doing so, each repetitive unit was identified by having the lone layer deposited followed by the multilayer structure layer, as seen at the substrate.

The repetitive unit's average value in thickness was determined by a sum of an average value in thickness of the multilayer structure layer and an average value in thickness of the lone layer. When the coating layer included more than 10 repetitive units, 10 successive repetitive units were selected in the coating layer, and an average value of the selected 10 repetitive units was defined as an average value in thickness of the more than 10 repetitive units. In doing so, the 10 layers were selected such that the interface between the fourth layer and the fifth layer in the selected 10 layers was closest to the center of the coating layer. The coating layer's average value in thickness was divided by the repetitive unit's average value in thickness to calculate the number of repetitive units.

Figure 6:
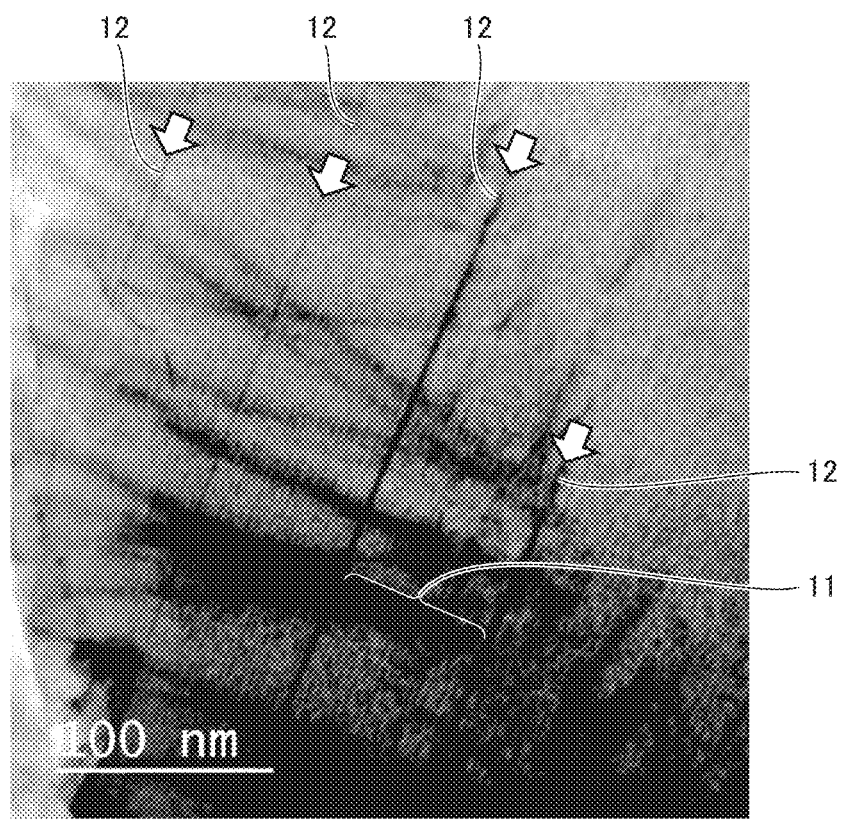
FIG. 6 is a photographic image of a coating layer of the cutting tool according to the present embodiment as obtained through a transmission electron microscope.

In determining the repetitive unit's maximum value in thickness, initially, a method similar to that described above was used to determine a thickness of each repetitive unit in a sample in the above-described cross section with a STEM (see FIG. 6 for example). Subsequently, the repetitive unit's determined value in thickness was compared with others' and a maximum value thereof was defined as a maximum value in thickness of the repetitive units. When the coating layer included more than 10 repetitive units, 10 successive repetitive units were selected in the coating layer, and a maximum value in the selected 10 repetitive units was defined as a maximum value in thickness of the more than 10 repetitive units. In doing so, the 10 layers were selected such that the interface between the fourth layer and the fifth layer in the selected 10 layers was closest to the center of the coating layer. In doing so, a numerical value which seemed to be an apparently unexpected value was excluded. In a similar manner, the repetitive unit's minimum value in thickness was also determined. A result is shown in Table 9. In table 9, an indication "-" means that there is no corresponding parameter.

TABLE 9

| ID symbol | lone layer average value in thickness (nm) | repetitive unit | | |
|---|---|---|---|---|
| | | average value in thickness (nm) | maximum value in thickness (nm) | minimum value in thickness (nm) |
| [1] | 5.9 | 57.4 | 91.8 | 45.1 |
| [2] | 3 | 67.2 | 102.1 | 55.7 |
| [3] | 6.1 | 54.7 | 93.9 | 47.3 |
| [4] | 3.2 | 70.8 | 105.8 | 59.6 |
| [5] | 4.4 | 80.7 | 108.2 | 58.2 |
| [6] | 3.8 | 86.1 | 106.9 | 54.6 |
| [7] | 6.5 | 87.0 | 106.8 | 53.6 |
| [8] | 4.8 | 93.3 | 104.4 | 58.1 |
| [9] | 8.2 | 79.8 | 95.3 | 48.7 |
| [10] | 6.6 | 58.3 | 92.7 | 46.0 |
| [11] | 7.9 | 62.7 | 97.4 | 50.9 |
| [12] | 5.2 | 42.3 | 75.9 | 38.7 |
| [13] | 10.9 | 115.5 | 152.8 | 67.9 |
| [14] | 4.7 | 44.0 | 97.7 | 36.2 |
| [15] | 11.3 | 120.4 | 158.0 | 73.3 |

TABLE 9-continued

| ID symbol | lone layer average value in thickness (nm) | repetitive unit | | |
|---|---|---|---|---|
| | | average value in thickness (nm) | maximum value in thickness (nm) | minimum value in thickness (nm) |
| [16] | 4.2 | 68.1 | 103.0 | 56.7 |
| [17] | 4.6 | 70.8 | 105.8 | 59.6 |
| [18] | — | — | — | — |
| [19] | 5000 | — | — | — |
| [20]* | — | — | — | — |

*deposited through known PVD.

<<Cutting Test>>

(Cutting Evaluation: Continuous Processing Test)

Using the cutting tools of the thus prepared samples (sample nos. 1-1 to 1-3 and 2 to 20) under the cutting conditions indicated below, a cutting distance (m) reached when the flank face was worn by an amount of 0.25 mm or the cutting edge portion was broken was measured. Moreover, how the cutting tools were damaged after cutting (i.e., a final damaged state) was observed. A result thereof is shown in table 10. A cutting tool providing a longer cutting distance can be assessed as a cutting tool excellent in impact resistance and oxidation resistance. It is believed that a cutting edge portion easily attains high temperature under the cutting conditions indicated below. Accordingly, when a cutting tool is not observed to have breakage in a damaged state after cutting, the cutting tool can be assessed as a cutting tool excellent in oxidation resistance.

Conditions for continuous processing test
Workpiece: SUS304 (a block material, W300× L50)
Cutter diameter: φ100
Cutting speed: 300 m/min.
Feed rate: 0.4 mm/t
Cutting Amount: 2 mm
Cutting width: 80 mm
Cutting oil: Dry type

TABLE 10

| sample nos. | cutting distance (m) | final damaged state |
|---|---|---|
| 1-1 | 6.3 | normally worn |
| 1-2 | 6 | normally worn |
| 1-3 | 5.1 | normally worn |
| 2 | 6.3 | normally worn |
| 3 | 5.4 | normally worn |
| 4 | 6.3 | normally worn |
| 5 | 6.9 | normally worn |
| 6 | 6.6 | normally worn |
| 7 | 5.4 | normally worn |
| 8 | 6 | normally worn |
| 9 | 5.1 | normally worn |
| 10 | 2.7 | abnormally worn |
| 11 | 2.4 | abnormally worn |
| 12 | 2.1 | abnormally worn |
| 13 | 2.4 | abnormally worn |
| 14 | 2.4 | abnormally worn |
| 15 | 2.1 | abnormally worn |
| 16 | 2.4 | abnormally worn |
| 17 | 2.1 | abnormally worn |
| 18 | 1.8 | abnormally worn |
| 19 | 1.5 | abnormally worn |
| 20 | 1.5 | abnormally worn |

As can be seen in Table 10, the cutting tools of sample Nos. 1-1 to 1-3 and 2 to 9 (that is, the cutting tools of examples) provided a good result of a cutting distance of 5.1 m or more in continuous processing. The cutting tools of Sample Nos. 1-1 to 1-3 and 2 to 9 had their cutting edge portions unbroken and normally worn (normally worn). In contrast, the cutting tools of sample Nos. 10 to 20 (the cutting tools of the comparative examples) provided a cutting distance of 2.7 m or less in continuous processing. The cutting tools of Sample Nos. 10 to 20 had a final damaged state of being abnormally worn. Being "abnormally worn" includes being abnormally increasingly worn and being increasingly worn starting from chipping or breakage. From the above results, it has been found that the cutting tools of the examples are excellent in impact resistance and oxidation resistance.

Thus while embodiments and examples of the present invention have been described, it is also initially planned to combine configurations of the embodiments and examples, as appropriate.

It should be understood that the embodiments and examples disclosed herein have been described for the purpose of illustration only and in a non-restrictive manner in any respect. The scope of the present invention is defined by the terms of the claims, rather than the embodiments and examples described above, and is intended to include any modifications within the meaning and scope equivalent to the terms of the claims.

REFERENCE SIGNS LIST

1 rake face, 2 flank face, 3 cutting edge ridge portion, 10 substrate, 11 multilayer structure layer, 11a first unit layer, 11b second unit layer, 12 lone layer, 13 underlying layer, 14 surface layer, 20 coating layer, 30 coating, 50 CVD apparatus, 52 substrate setting jig, 53 reaction container, 54 temperature controller, 55 first gas introduction pipe, 56 second gas introduction pipe, 57 third gas introduction pipe, 58 gas introduction pipe, 59 gas exhaust pipe, 60 gas exhaust port, 100 cutting tool

The invention claimed is:

1. A cutting tool comprising a substrate and a coating layer provided on the substrate,
   the coating layer including a multilayer structure layer composed of a first unit layer and a second unit layer, and a lone layer,
   the first unit layer and the second unit layer being alternately stacked,
   the multilayer structure layer and the lone layer being stacked such that more than one multilayer structure layer and more than one lone layer are alternately stacked,
   the first unit layer including cubic $Al_xTi_{1-x}N$ crystal grains,
   the second unit layer including cubic $Al_yTi_{1-y}N$ crystal grains,
   the lone layer including cubic $Ti_zAl_{1-z}N$ crystal grains,
   an atomic ratio x of Al in the $Al_xTi_{1-x}N$ being 0.8 or more and 0.95 or less,
   an atomic ratio y of Al in the $Al_yTi_{1-y}N$ being 0.7 or more and less than 0.8,
   an atomic ratio z of Ti in the $Ti_zAl_{1-z}N$ being 0.4 or more and less than 0.55,
   the first unit layer having a thickness with an average value of 2.5 nm or more and 5 nm or less,
   the second unit layer having a thickness with an average value of 2.5 nm or more and 5 nm or less,
   the multilayer structure layer having a thickness with an average value of 40 nm or more and 95 nm or less,
   the lone layer having a thickness with an average value of 2.5 nm or more and 10 nm or less,
   one multilayer structure layer and one lone layer forming a repetitive unit having a thickness with an average value of 50 nm or more and 100 nm or less, a maximum value of 90 nm or more and 110 nm or less, and a minimum value of 40 nm or more and 60 nm or less.

2. The cutting tool according to claim 1, wherein the lone layer has a thickness with an average value of 2.5 nm or more and 5 nm or less.

3. The cutting tool according to claim 1, wherein the repetitive unit has a thickness with an average value of 55 nm or more and 95 nm or less, a maximum value of 90 nm or more and 100 nm or less, and a minimum value of 50 nm or more and 60 nm or less.

4. The cutting tool according to claim 1, wherein the coating layer has a thickness with an average value of 0.1 μm or more and 10 μm or less.

5. The cutting tool according to claim 1, further comprising an underlying layer provided between the substrate and the coating layer, wherein
   the underlying layer is composed of a compound consisting of: at least one element selected from the group consisting of a group 4 element, a group 5 element and a group 6 element of the periodic table and aluminum; and at least one element selected from the group consisting of carbon, nitrogen, oxygen and boron, and
   the underlying layer is different in composition from the first unit layer, the second unit layer, and the lone layer.

6. The cutting tool according to claim 1, further comprising a surface layer provided on the coating layer, wherein
   the surface layer is composed of a compound consisting of at least one element selected from the group consisting of: a group 4 element, a group 5 element and a group 6 element of the periodic table and aluminum; and at least one element selected from the group consisting of carbon, nitrogen, oxygen and boron, and
   the surface layer is different in composition from the first unit layer, the second unit layer, and the lone layer.

* * * * *